United States Patent
Kubota et al.

(10) Patent No.: US 8,609,521 B2
(45) Date of Patent: Dec. 17, 2013

(54) METHOD OF MANUFACTURING SEMICONDUCTOR DEVICE

(75) Inventors: Ryosuke Kubota, Osaka (JP); Keiji Wada, Osaka (JP); Takeyoshi Masuda, Osaka (JP); Hiromu Shiomi, Osaka (JP)

(73) Assignee: Sumitomo Electric Industries, Ltd., Osaka-Shi (JP)

( * ) Notice: Subject to any disclaimer, the term of this patent is extended or adjusted under 35 U.S.C. 154(b) by 0 days.

(21) Appl. No.: 13/583,564

(22) PCT Filed: Nov. 7, 2011

(86) PCT No.: PCT/JP2011/075590
§ 371 (c)(1),
(2), (4) Date: Sep. 7, 2012

(87) PCT Pub. No.: WO2012/077443
PCT Pub. Date: Jun. 14, 2012

(65) Prior Publication Data
US 2013/0040445 A1    Feb. 14, 2013

(30) Foreign Application Priority Data
Dec. 7, 2010   (JP) ................................ 2010-272622

(51) Int. Cl.
*H01L 21/265* (2006.01)
(52) U.S. Cl.
USPC .......... 438/522; 438/149; 438/166; 438/455; 438/487; 438/514; 257/E21.057
(58) Field of Classification Search
None
See application file for complete search history.

(56) References Cited

U.S. PATENT DOCUMENTS

| | | | |
|---|---|---|---|
| 4,375,993 A | 3/1983 | Mori et al. | |
| 6,255,201 B1 * | 7/2001 | Yoshida et al. | 438/535 |
| 6,599,819 B1 | 7/2003 | Goto | |
| 2008/0227277 A1 | 9/2008 | Nakazawa | |

FOREIGN PATENT DOCUMENTS

| | | |
|---|---|---|
| JP | 56-142630 A | 11/1981 |
| JP | 2000-340671 A | 12/2000 |
| JP | 2002-289550 A | 10/2002 |
| JP | 2008-244446 A | 10/2008 |

* cited by examiner

*Primary Examiner* — Kyoung Lee
(74) *Attorney, Agent, or Firm* — Venable LLP; Michael A. Sartori (57) ABSTRACT

A silicon carbide substrate having a surface is prepared. An impurity region is formed by implanting ions from the surface into the silicon carbide substrate. Annealing for activating the impurity region is performed. The annealing includes the step of applying first laser light having a first wavelength to the surface of the silicon carbide substrate, and the step of applying second laser light having a second wavelength to the surface of the silicon carbide substrate. The silicon carbide substrate has first and second extinction coefficients at the first and second wavelengths, respectively. A ratio of the first extinction coefficient to the first wavelength is higher than $5\times10^5$/m. A ratio of the second extinction coefficient to the second wavelength is lower than $5\times10^5$/m. Consequently, damage to the surface of the silicon carbide substrate during laser annealing can be reduced.

9 Claims, 6 Drawing Sheets

METHOD OF MANUFACTURING SEMICONDUCTOR DEVICE

TECHNICAL FIELD

The present invention relates to methods of manufacturing semiconductor devices, and more particularly to a method of manufacturing a semiconductor device including a silicon carbide substrate.

BACKGROUND ART

A silicon carbide substrate has recently begun to be used for manufacturing a semiconductor device. Silicon carbide has a wider band gap than silicon, which is a more common material. Thus, a semiconductor device including a silicon carbide substrate has advantages such as high breakdown voltage, low on-resistance, and small performance reduction under a high temperature environment.

As in a method of manufacturing a semiconductor device including a silicon substrate, an annealing step for activating an impurity region is required in a method of manufacturing a semiconductor device including a silicon carbide substrate. Different materials for a substrate require different optimal annealing steps, however. For example, Japanese Patent Laying-Open No. 2002-289550 (Patent Literature 1) discloses an annealing step of irradiating a wide band gap semiconductor such as silicon carbide with laser light having energy equal to or larger than the band gap.

CITATION LIST

Patent Literature
PTL 1: Japanese Patent Laying-Open No. 2002-289550

SUMMARY OF INVENTION

Technical Problem

Laser annealing with an intensity required to sufficiently activate an impurity region using the above conventional technique, however, may cause damage to a surface of a silicon carbide substrate, resulting in lowered reliability of a semiconductor device. For example, the surface of the silicon carbide substrate may be roughened, resulting in lowered reliability of a film formed thereon, particularly a gate insulating film.

Accordingly, an object of the present invention is to provide a method of manufacturing a semiconductor device capable of reducing damage to a surface of a silicon carbide substrate during laser annealing.

Solution to Problem

A method of manufacturing a semiconductor device of the present invention includes the following steps. A silicon carbide substrate having a surface is prepared. An impurity region is formed by implanting ions from the surface into the silicon carbide substrate. Annealing for activating the impurity region is performed. The annealing includes the step of applying first laser light having a first wavelength to the surface of the silicon carbide substrate, and the step of applying second laser light having a second wavelength to the surface of the silicon carbide substrate. The silicon carbide substrate has first and second extinction coefficients at the first and second wavelengths, respectively. A ratio of the first extinction coefficient to the first wavelength is higher than $5 \times 10^5$/m. A ratio of the second extinction coefficient to the second wavelength is lower than $5 \times 10^5$/m.

According to this manufacturing method, the annealing is performed by combination of the first laser light that tends to be absorbed particularly near the surface of the silicon carbide substrate, and the second laser light that tends to reach a deep position from the surface of the silicon carbide substrate. Thus, an amount of laser light absorbed in a depth direction of the impurity region can be more optimized than when the annealing is performed with single laser light. Namely, the annealing conditions can be adjusted such that a portion near the surface is not annealed more strongly than necessary, while a region deep in the silicon carbide substrate is sufficiently annealed. Thus, damage to the surface of the silicon carbide substrate can be reduced.

Preferably, the step of forming an impurity region includes the following steps. A first impurity layer having a first impurity concentration and reaching a first depth with reference to the surface of the silicon carbide substrate is formed. A second impurity layer having a second impurity concentration and reaching a second depth with reference to the surface of the silicon carbide substrate is formed. The second depth is smaller than the first depth, and the second impurity concentration is higher than the first impurity concentration.

In this case, the first laser light that tends to be absorbed in a shallower position than the second laser light contributes mainly to the annealing of the second impurity layer located in a shallower position than the first impurity layer. Consequently, the second laser light can be optimized to anneal mainly the first impurity layer. The first impurity layer is sufficiently activated by relatively weak annealing due to its impurity concentration lower than that of the second impurity layer. Thus, the intensity of the second laser light can be reduced. Accordingly, damage to the surface of the silicon carbide substrate can be reduced.

Preferably, the step of applying first laser light is a step of applying the first laser light only to a first region which is a portion of the surface of the silicon carbide substrate. Thus, damage to a portion of the surface other than the first region can be prevented.

Preferably, the step of applying second laser light is a step of applying the second laser light to a second region of the surface of the silicon carbide substrate, the first region being smaller than the second region. Thus, a portion of the surface irradiated with both of the first and second laser lights, i.e., a portion that tends to be significantly damaged can be made smaller than when the first region has the same size as the second region.

One of the step of applying first laser light and the step of applying second laser light may be performed after the other. In this case, the step of applying first laser light and the step of applying second laser light can be independently controlled.

The step of applying first laser light and the step of applying second laser light may be simultaneously performed. In this case, heating is performed simultaneously with both laser lights, to heat the silicon carbide substrate to a higher temperature. Thus, stronger annealing can be performed.

Preferably, the step of performing annealing includes the step of heating the silicon carbide substrate by a heater. Thus, the intensity of laser light required for sufficient annealing can be reduced.

Preferably, the step of performing annealing is carried out in any of an inert gas atmosphere and an atmosphere under a reduced pressure from atmospheric pressure. Thus, deterioration of the surface of the silicon carbide substrate can be suppressed.

Preferably, photon energy of each of the first and second laser lights is higher than band gap energy of the silicon carbide substrate. Thus, the first and second laser lights are absorbed in the silicon carbide substrate with greater efficiency.

Advantageous Effects of Invention

As is clear from the above description, according to the present invention, damage to a surface of a silicon carbide substrate during laser annealing can be reduced.

DESCRIPTION OF EMBODIMENTS

An embodiment of the present invention will be described with reference to the drawings.

Figure 1:
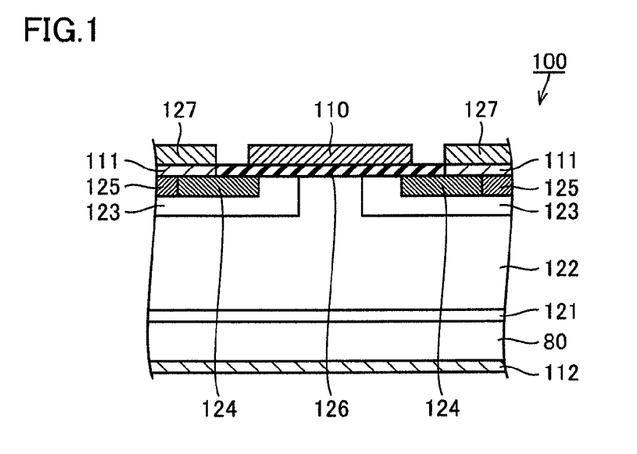
FIG. 1 is a cross sectional view schematically illustrating a structure of a semiconductor device in an embodiment of the present invention.

As shown in FIG. 1, a semiconductor device 100 in this embodiment is a vertical DiMOSFET (Double Implanted Metal Oxide Semiconductor Field Effect Transistor), and includes an oxide film 126, a source electrode 111, an upper source electrode 127, a gate electrode 110, a drain electrode 112, and a silicon carbide substrate. The silicon carbide substrate includes a base substrate 80, a buffer layer 121, an n⁻ layer 122, a $p_B$ region 123 (first impurity layer), and a region (second impurity layer) having an n⁺ region 124 and a p⁺ region 125.

Base substrate 80 is made of single crystal silicon carbide. Base substrate 80 preferably has a hexagonal crystal structure, and more preferably has a 4H polytype. Base substrate 80 is of n conductivity type in this embodiment, and has an n conductivity type impurity concentration on the order of about $10^{19}$ cm$^{-3}$, for example. Buffer layer 121 is of n conductivity type, and has a thickness of 0.5 μm, for example. Buffer layer 121 has an n conductivity type impurity concentration on the order of $10^{17}$ to $10^{18}$ cm$^{-3}$, for example.

N⁻ layer 122 is a breakdown voltage holding layer formed on buffer layer 121, and is made of silicon carbide of n conductivity type. N⁻ layer 122 has a thickness of 10 μm, for example, and an n conductivity type impurity concentration on the order of $10^{15}$ cm$^{-3}$, for example.

In a surface of n layer 122, a plurality of $p_B$ regions 123 of p conductivity type are formed at a distance from each other. $P_B$ region 123 has a thickness of about 0.7 μm, for example. $P_B$ region 123 has a p conductivity type impurity concentration on the order of $10^{17}$ to $10^{18}$ cm$^{-3}$, for example.

In each of $p_B$ regions 123, n⁺ region 124 is formed in a surface layer of $p_B$ region 123. P⁺ region 125 is formed in a position adjacent to n⁺ region 124. That is, a depth of n⁺ region 124 and p⁺ region 125 with reference to a surface of the silicon carbide substrate is smaller than a depth of $p_B$ region 123 with reference to the surface of the silicon carbide substrate.

An n conductivity type impurity concentration in n⁺ region 124 and a p conductivity type impurity concentration in p⁺ region 125 are on the order of $10^{19}$ to $10^{20}$ cm$^{-3}$, for example. That is, the n conductivity type impurity concentration in n⁺ region 124 and the p conductivity type impurity concentration in p⁺ region 125 are higher than the p conductivity type impurity concentration in $p_B$ region 123.

Oxide film 126 is formed to extend from over n⁺ region 124 in one of $p_B$ regions 123, through over that $p_B$ region 123, n⁻ layer 122 exposed between two $p_B$ regions 123, the other $p_B$ region 123, onto n⁺ region 124 in the other $p_B$ region 123. Gate electrode 110 is formed on oxide film 126. Source electrode 111 is formed on n⁺ region 124 and p⁺ region 125. Upper source electrode 127 is formed on source electrode 111.

Figure 2:
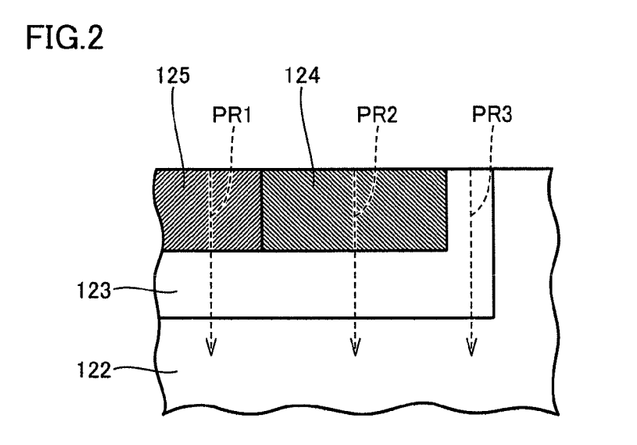
FIG. 2 is an enlarged view of a portion in FIG. 1.
Figure 3:
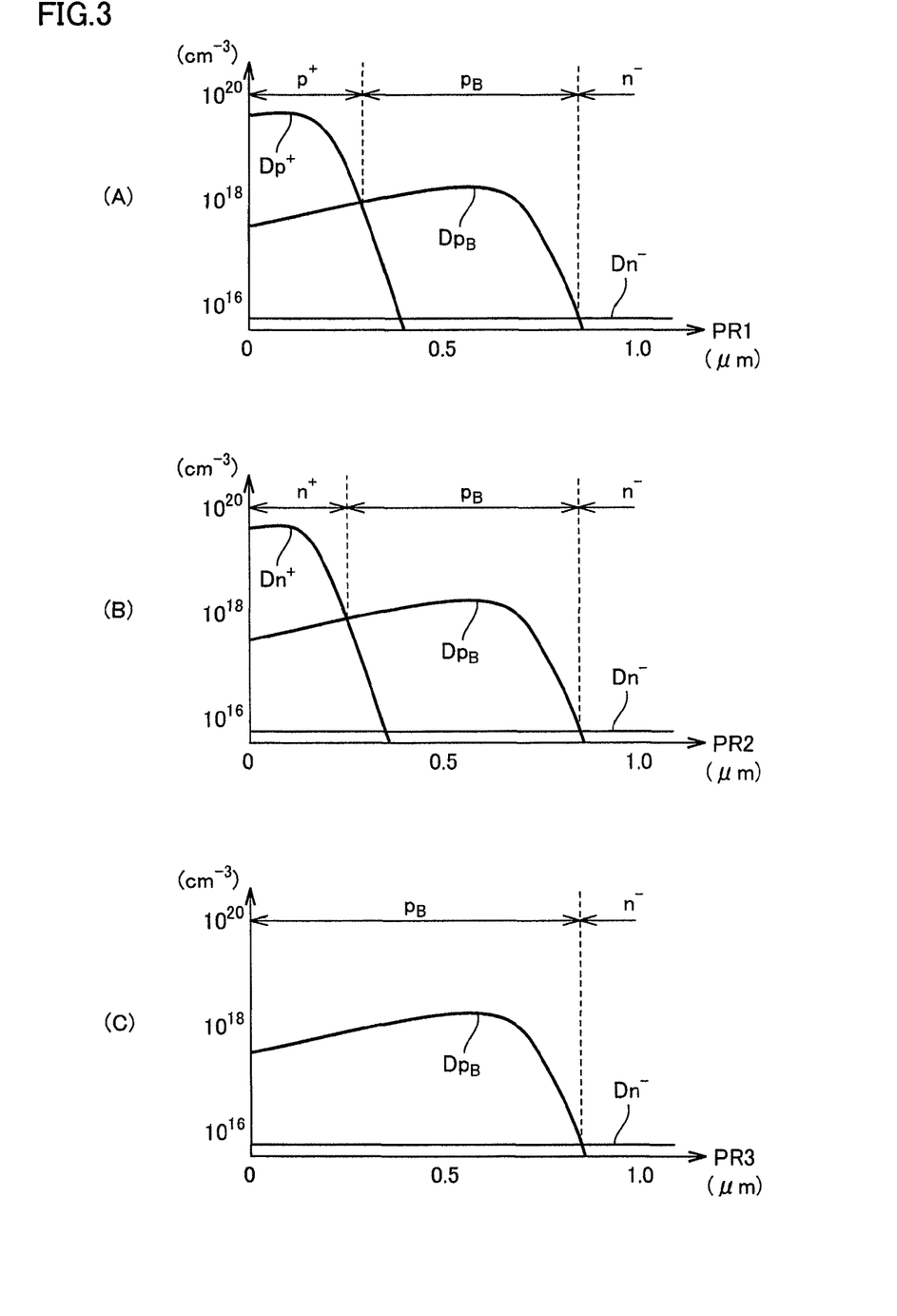
FIG. 3(A) illustrates an impurity concentration profile along an arrow PR1 in FIG. 2.
FIG. 3(B) illustrates an impurity concentration profile along an arrow PR2 in FIG. 2.
FIG. 3(C) illustrates an impurity concentration profile along an arrow PR3 in FIG. 2.

FIGS. 3(A) to 3(C) illustrate impurity concentration profiles along arrows PR1 to PR3 (FIG. 2) of semiconductor device 100. In the impurity concentration profile along arrow PR1 of semiconductor device 100 (FIG. 3(A)), a section p⁺ corresponding to p⁺ region 125, a section $p_B$ corresponding to $p_B$ region 123, and a section n⁻ corresponding to n⁻ layer 122 are illustrated. Profiles Dp⁺ and D$p_B$ represent ion implantation profiles for the purpose of forming p⁺ region 125 and $p_B$ region 123, respectively. A profile Dn⁻ corresponds to an impurity concentration when forming n⁻ layer 122. In the impurity concentration profile along arrow PR2 of semiconductor device 100 (FIG. 3(B)), a section n⁺ corresponding to n⁺ region 124, section $p_B$ corresponding to $p_B$ region 123, and section n⁻ corresponding to n⁻ layer 122 are illustrated. A profile Dn⁺ represents an ion implantation profile for the purpose of forming n⁺ region 124.

Figure 4:
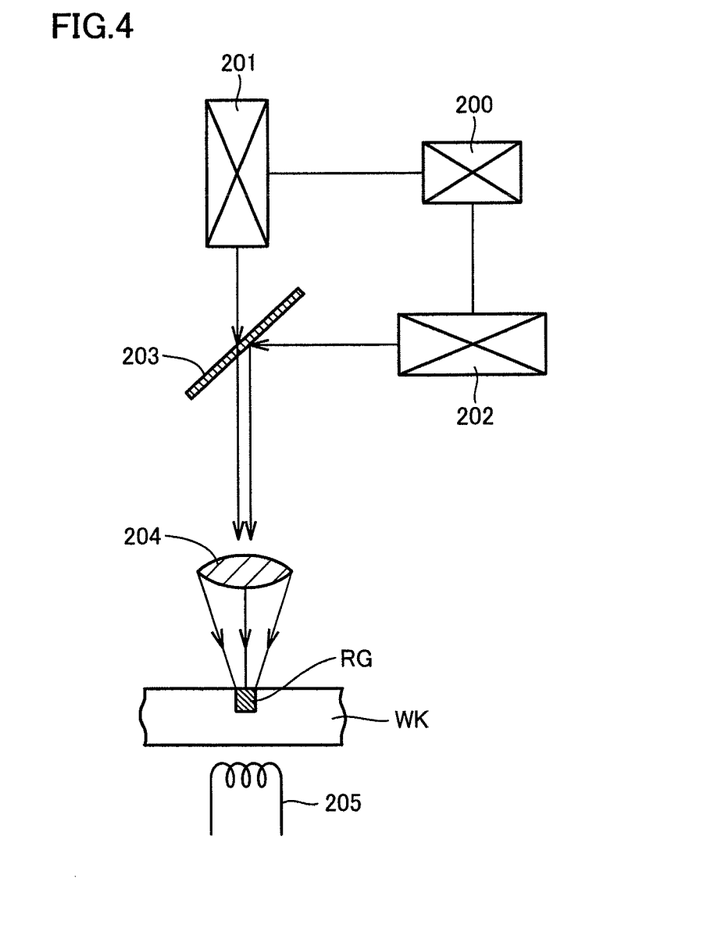
FIG. 4 is a cross sectional view schematically illustrating a laser annealing device used in a method of manufacturing a semiconductor device in the embodiment of the present invention.

Referring to FIG. 4, a laser annealing device used for activating an ion implanted impurity is described. This device includes first and second lasers 201 and 202, a trigger unit 200, a half mirror 203, a condenser lens 204, and a heater 205. A dichroic mirror may be used instead of the half mirror.

Trigger unit 200 transmits a trigger signal to first and second lasers 201 and 202 at the same time or at different timings. In response to the trigger signal from trigger unit 200, first and second lasers 201 and 202 emit pulse laser lights having first and second wavelengths, respectively. Half mirror 203 is arranged such that both of the laser lights from first and second lasers 201 and 202 enter condenser lens 204 along an optical axis. Condenser lens 204 condenses the laser lights from first and second lasers 201 and 202 onto an annealed region RG of work WK. Annealed region RG is laser annealed with the condensed laser light. Heater 205 heats work WK to assist the laser annealing.

Wavelengths X and Y (meter) of the laser lights generated by first and second lasers 201 and 202, respectively, are selected to satisfy the following equation, provided that an extinction coefficient of silicon carbide with respect to light having a wavelength W (meter) is represented as k (W):

$$k(Y)/Y \leq 5\times 10^5 < k(X)/X$$

Thus, the laser light from first laser 201 tends to be absorbed near a surface of work WK compared to the laser light from second laser 202. In other words, the laser light from second laser 202 tends to reach a deeper position in work WK than the laser light from first laser 201.

Figure 5:
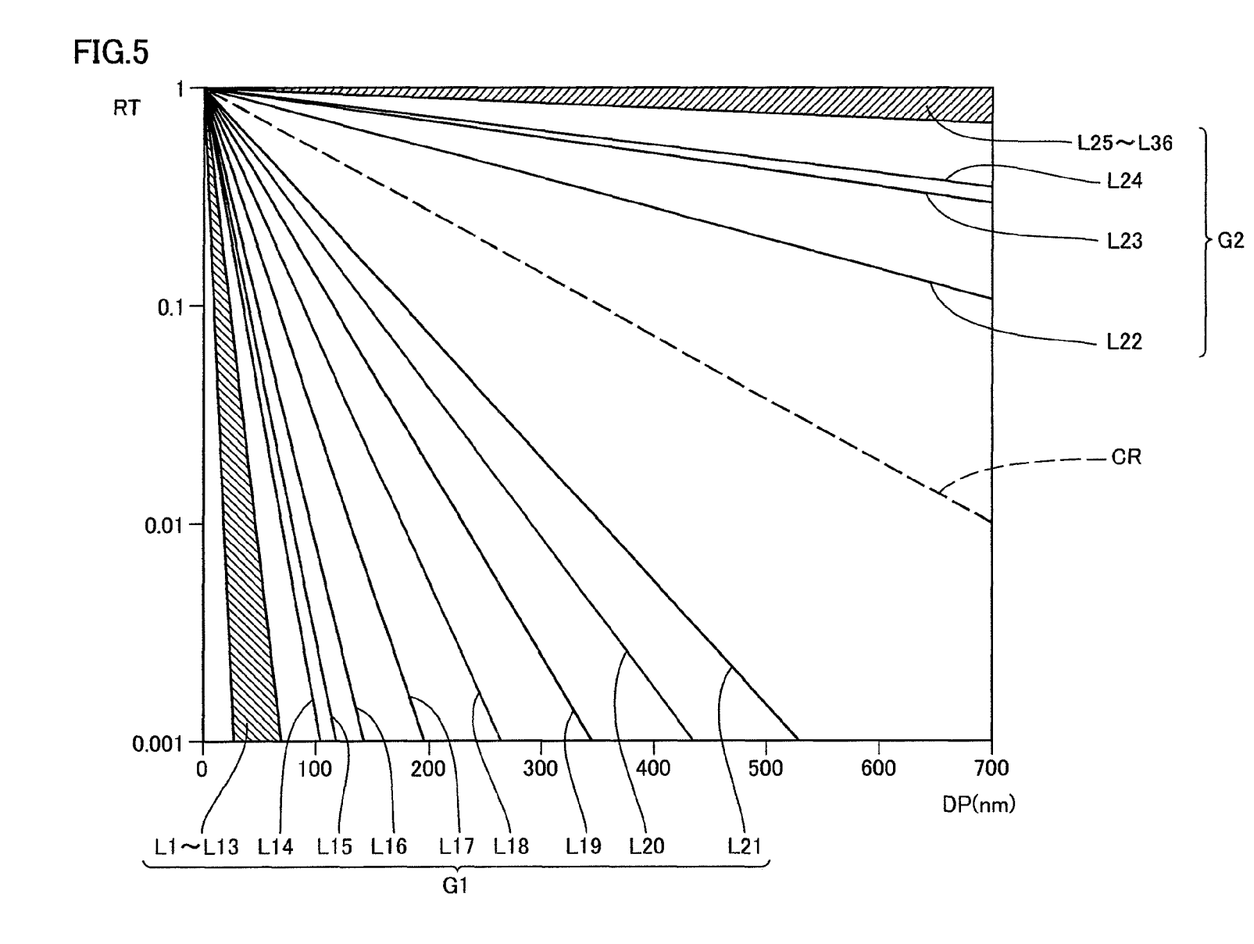
FIG. 5 is a graph illustrating absorption of laser lights used in the method of manufacturing a semiconductor device in the embodiment of the present invention.

FIG. 5 is a graph illustrating variation in light intensity RT when lights having wavelengths L1 to L36 reach a depth DP in silicon carbide. Wavelengths L1 to L21 are classified as a first group G1, and wavelengths L22 to L36 are classified as a second group G2. First group G1 has a higher k (W)/W than second group G2, with a boundary CR between them corresponding to k (W)/W=5×10⁵. The wavelengths belonging to first group G1 correspond to first laser 201, and the wavelengths belonging to second group G2 correspond to second laser 202.

Wavelengths L1 to L36 have the following values: wavelength L1=263.8 nm, L2=266.6 nm, L3=325 nm, L4=326.3 nm, L5=269.5 nm, L6=407.8 nm, L7=272.5 nm, L8=335.1 nm, L9=410.5 nm, L10=344.4 nm, L11=281.8 nm, L12=285 nm, L13=355 nm, L14=200 nm, L15=400 nm, L16=206.6 nm, L17=213.8 nm, L18=221.4 nm, L19=229.6 nm, L20=238.4 nm, L21=248 nm, L22=261 nm, L23=275.5 nm, L24=278.6 nm, L25=302.4 nm, L26=308 nm, L27=315 nm, L28=317.9 nm, L29=364.7 nm, L30=375 nm, L31=375.7 nm, L32=387.5 nm, L33=397 nm, L34=402.5 nm, L35=405.2 nm, L36=413.3 nm.

Due to their similar characteristics, wavelengths L1 to L13 are represented as a single hatching area instead of graphs. The same applies to wavelengths L25 to L36.

A method of manufacturing semiconductor device 100 will now be described.

Figure 6:
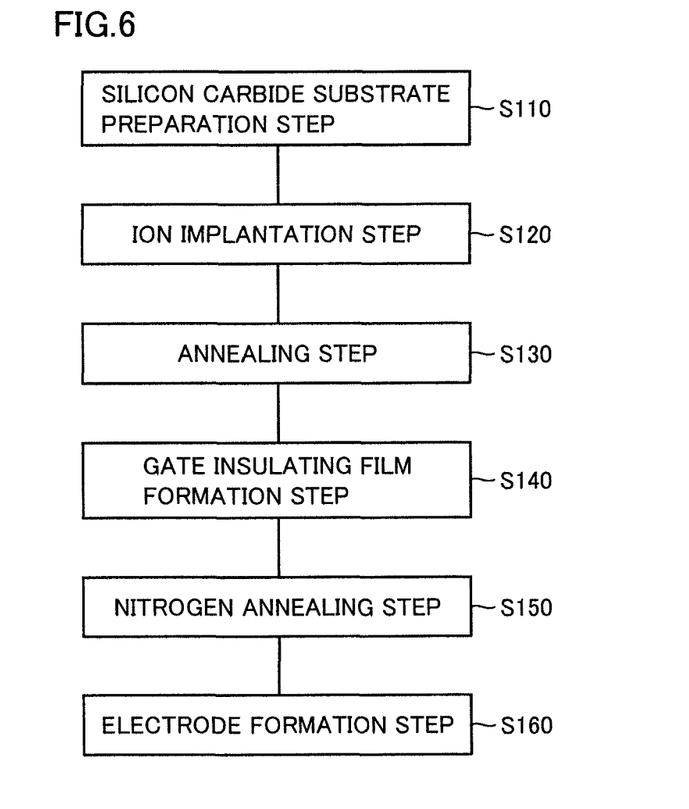
FIG. 6 is a flow diagram schematically illustrating the method of manufacturing a semiconductor device in the embodiment of the present invention.
Figure 7:
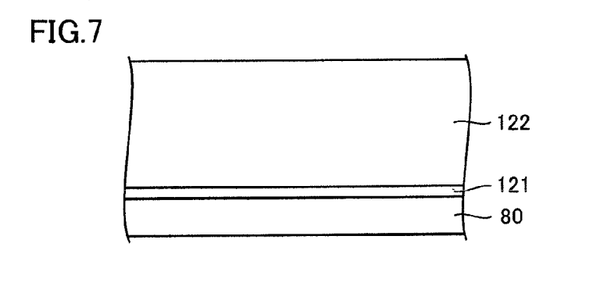
FIG. 7 is a partial cross sectional view schematically illustrating a first step of the method of manufacturing a semiconductor device in the embodiment of the present invention.

Referring to FIG. 7, first, a substrate preparation step (step S110: FIG. 6) is performed to prepare a silicon carbide substrate as follows.

First, buffer layer 121 is formed on base substrate 80. In this embodiment, base substrate 80 is of n conductivity type. Buffer layer 121 is made of silicon carbide of n conductivity type, and is an epitaxial layer having a thickness of 0.5 μm, for example. Buffer layer 121 has a conduction impurity concentration of $5\times 10^{17}$ cm$^{-3}$, for example.

Then, n⁻ layer 122 is formed on buffer layer 121. Specifically, a layer made of silicon carbide of n conductivity type is formed by epitaxial growth. N⁻ layer 122 has a thickness of 10 μm, for example. N⁻ layer 122 has an n conductivity type impurity concentration of $5\times 10^{15}$ cm$^{-3}$, for example.

Consequently, the silicon carbide substrate including base substrate 80, buffer layer 121 and n⁻ layer 122 (FIG. 7) is prepared. This silicon carbide substrate has a surface made of n⁻ layer 122 (upper surface in FIG. 7) and a rear surface made of base substrate 80 (lower surface in FIG. 7).

Figure 8:
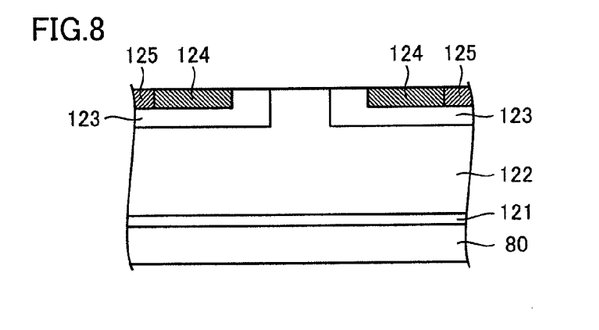
FIG. 8 is a partial cross sectional view schematically illustrating a second step of the method of manufacturing a semiconductor device in the embodiment of the present invention.

Referring to FIG. 8, an ion implantation step (step S120: FIG. 6) is performed to form the impurity regions ($p_B$ region 123, n⁺ region 124 and p⁺ region 125) by implanting ions from the surface of the silicon carbide substrate into the silicon carbide substrate. Specifically, the impurity regions are formed as follows.

First, a p conductivity type impurity is selectively implanted into a portion of n⁻ layer 122, to form $p_B$ region 123. Then, an n conductivity type impurity is selectively implanted into a prescribed region to form n⁺ region 124, and a p conductivity type impurity is selectively implanted into a prescribed region to form p⁺ region 125. The selective implantations of the impurities are performed using a mask formed of an oxide film, for example.

Next, an annealing step (step S130: FIG. 6) for activating the implanted impurities is performed using the laser annealing device shown in FIG. 4. That is, laser light having a wavelength selected from first group G1 (FIG. 5) (first laser light) and laser light having a wavelength selected from second group G2 (FIG. 5) (second laser light) are applied to the surface of the silicon carbide substrate.

Preferably, the step of applying the first laser light is a step of applying the first laser light only to a first region which is a portion of the surface of the silicon carbide substrate. The first region includes at least n⁺ region 124 and p⁺ region 125. Preferably, the step of applying the second laser light is a step of applying the second laser light to a second region which is a portion of the surface of the silicon carbide substrate. The second region includes at least $p_B$ region 123. More preferably, the first region is smaller than the second region.

The steps of applying the first and second laser lights may be performed successively or simultaneously. It is preferable to raise the temperature of the silicon carbide substrate by heater 205 (FIG. 4) before the first and second laser lights enter the substrate. It is preferable to apply the first and second laser lights either in an inert gas atmosphere, or in an atmosphere under a reduced pressure from atmospheric pressure. It is preferable that photon energy of each of the first and second laser lights be higher than band gap energy of the silicon carbide substrate.

Figure 9:
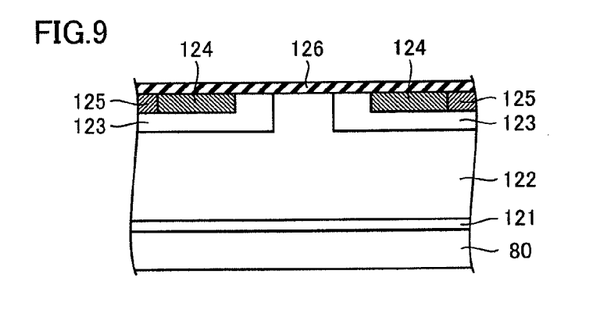
FIG. 9 is a partial cross sectional view schematically illustrating a third step of the method of manufacturing a semiconductor device in the embodiment of the present invention.

Referring to FIG. 9, a gate insulating film formation step (step S140: FIG. 6) is performed. Specifically, oxide film 126 is formed to cover n⁻ layer 122, $p_B$ regions 123, n⁺ regions 124, and p⁺ regions 125. This formation may be done with dry oxidation (thermal oxidation). The dry oxidation is performed under the condition of a heating temperature of 1200° C. and a heating period of 30 minutes, for example.

Next, a nitrogen annealing step (step S150: FIG. 6) is performed. Specifically, an annealing process is performed in a nitrogen monoxide (NO) atmosphere. This process is performed under the condition of a heating temperature of 1100° C. and a heating period of 120 minutes, for example. As a result, nitrogen atoms are introduced into a portion near an interface between each of n⁻ layer 122, $p_B$ regions 123, n⁺ regions 124, p⁺ regions 125, and oxide film 126.

After this annealing step using nitrogen monoxide, an annealing process using an argon (Ar) gas which is inert gas may be further performed. This process is performed under the condition of a heating temperature of 1100° C. and a heating period of 60 minutes, for example.

Figure 10:
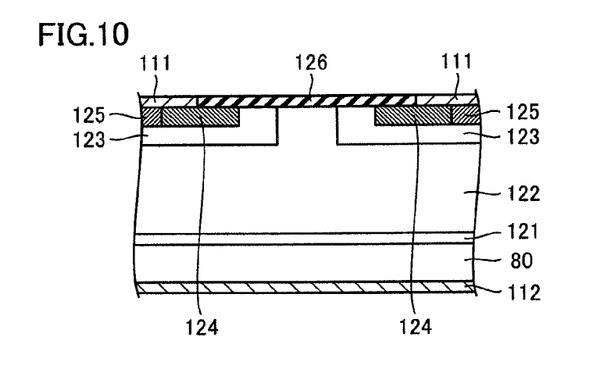
FIG. 10 is a partial cross sectional view schematically illustrating a fourth step of the method of manufacturing a semiconductor device in the embodiment of the present invention.

Referring to FIG. 10, an electrode formation step (step S160: FIG. 6) is performed to form source electrode 111 and drain electrode 112 as follows.

First, a resist film having a pattern is formed on oxide film 126 by photolithography. Using this resist film as a mask, a portion of oxide film 126 located on n⁺ region 124 and p⁺ region 125 is removed by etching. An opening is thus formed in oxide film 126. Then, a conductor film is formed to be in contact with n⁺ region 124 and p⁺ region 125 in this opening. The resist film is then removed to remove (lift off) a portion of the conductor film that has been located on the resist film. This conductor film may be a metal film, and is made of nickel (Ni), for example. As a result of this liftoff, source electrode 111 is formed.

It is preferable to perform heat treatment for alloyzation. For example, heat treatment is performed for two minutes in an atmosphere of an argon (Ar) gas which is inert gas at a heating temperature of 950° C.

Referring back to FIG. 1, upper source electrode 127 is formed on source electrode 111. Drain electrode 112 is formed on the rear surface of base substrate 80. Gate electrode 110 is formed on oxide film 126. Consequently, semiconductor device 100 is obtained.

According to this embodiment, the annealing is performed by combination of the laser light of first group G1 (FIG. 5) that tends to be absorbed particularly near the surface of the silicon carbide substrate, and the laser light of second group G2 (FIG. 5) that tends to reach a deep position from the surface of the silicon carbide substrate. Thus, an amount of laser light absorbed in a depth direction of the impurity regions can be more optimized than when the annealing is performed with single laser light. Namely, the annealing conditions can be adjusted such that a portion near the surface is not annealed more strongly than necessary, while a region deep in the silicon carbide substrate is sufficiently annealed. Thus, damage to the surface of the silicon carbide substrate can be reduced.

The above function and effect is particularly useful in a structure having a diffusion region of relatively low concentration such as $p_B$ region 123 and a diffusion region of relatively high concentration such as $n^+$ region 124 and $p^+$ region 125 at a surface side of the low concentration diffusion region, i.e., a structure having double diffusion. Specifically, laser light of first group G1 that tends to be absorbed in a shallower position than laser light of second group G2 contributes mainly to the annealing of $n^+$ region 124 and $p^+$ region 125 located in a shallower position than $p_B$ region 123. Consequently, the laser light of second group G2 can be optimized to anneal mainly $p_B$ region 123. $P_B$ region 123 is sufficiently activated by relatively weak annealing due to its impurity concentration lower than those of $n^+$ region 124 and $p^+$ region 125. Thus, the intensity of the laser light of second group G2 can be made lower than when the laser light of first group G1 is not used together. Thus, damage to the surface of the silicon carbide substrate can be reduced.

Further, since the laser light of first group G1 is applied only to a partial region of the surface of silicon carbide, damage to the other region and warp of the substrate can be suppressed. Furthermore, since the region irradiated with the laser light of first group G1 is smaller than the region irradiated with the laser light of second group G2, a portion of the surface irradiated with both laser lights, i.e., a portion that tends to be more significantly damaged can be made smaller than when both regions have the same size. In particular, damage to a portion of the surface of the silicon carbide substrate opposite gate electrode 110 (FIG. 1) can be suppressed, to improve reliability of semiconductor device 100. This is because surface roughness due to the damage of this portion results in lowered reliability of the gate insulating film (oxide film 126) formed on this portion, facilitating the generation of leak current.

The laser lights of first group G1 and second group G2 may be successively applied. In this case, the application steps can be controlled independently of each other. Alternatively, the laser lights may be simultaneously applied. In this case, the silicon carbide substrate is heated to a higher temperature than when the lights are applied separately. Thus, stronger annealing can be performed.

If heater 205 (FIG. 4) is used, the intensity of laser light required for sufficient annealing can be reduced.

If the annealing is performed either in an inert gas atmosphere, or in an atmosphere under a reduced pressure from atmospheric pressure, deterioration of the surface of the silicon carbide substrate can be suppressed.

If photon energy of laser light used for the laser annealing is higher than band gap energy of the silicon carbide substrate, the laser light can be absorbed in the silicon carbide substrate with greater efficiency.

It is noted that a structure in which the conductivity types in this embodiment are reversed, i.e., a structure in which p type and n type are reversed may be used.

While a vertical DiMOSFET has been illustrated, another semiconductor device such as a RESURF-JFET (Reduced Surface Field-Junction Field Effect Transistor) or a Schottky diode may be manufactured using the semiconductor substrate of the present invention.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 100 semiconductor device; 110 gate electrode; 111 source electrode; 112 drain electrode; 121 buffer layer; 122 $n^-$ layer; 123 $p_B$ region; 124 $n^+$ region; 125 $p^+$ region; 126 oxide film; 127 upper source electrode, 200 trigger unit; 201 first laser; 202 second laser; 203 half mirror; 204 condenser lens; 205 heater.

The invention claimed is:

1. A method of manufacturing a semiconductor device, comprising the steps of:
preparing a silicon carbide substrate having a surface;
forming an impurity region by implanting ions from said surface into said silicon carbide substrate; and
performing annealing for activating said impurity region, said step of performing annealing including the step of applying first laser light having a first wavelength to said surface of said silicon carbide substrate, and the step of applying second laser light having a second wavelength to said surface of said silicon carbide substrate, and
said silicon carbide substrate having first and second extinction coefficients at said first and second wavelengths, respectively, a ratio of said first extinction coefficient to said first wavelength being higher than $5 \times 10^5/$m, and a ratio of said second extinction coefficient to said second wavelength being lower than $5 \times 10^5/$m.

2. The method of manufacturing a semiconductor device according to claim 1, wherein
said step of forming an impurity region includes the steps of
forming a first impurity layer having a first impurity concentration and reaching a first depth with reference to said surface of said silicon carbide substrate, and
forming a second impurity layer having a second impurity concentration and reaching a second depth with reference to said surface of said silicon carbide substrate, and
said second depth is smaller than said first depth, and said second impurity concentration is higher than said first impurity concentration.

3. The method of manufacturing a semiconductor device according to claim 1, wherein
said step of applying first laser light is a step of applying said first laser light only to a first region which is a portion of said surface of said silicon carbide substrate.

4. The method of manufacturing a semiconductor device according to claim 3, wherein
   said step of applying second laser light is a step of applying said second laser light to a second region of said surface of said silicon carbide substrate, said first region being smaller than said second region.

5. The method of manufacturing a semiconductor device according to claim 1, wherein
   one of said step of applying first laser light and said step of applying second laser light is performed after the other.

6. The method of manufacturing a semiconductor device according to claim 1, wherein
   said step of applying first laser light and said step of applying second laser light are simultaneously performed.

7. The method of manufacturing a semiconductor device according to claim 1, wherein
   said step of performing annealing includes the step of heating said silicon carbide substrate by a heater.

8. The method of manufacturing a semiconductor device according to claim 1, wherein
   said step of performing annealing is carried out in any of an inert gas atmosphere and an atmosphere under a reduced pressure from atmospheric pressure.

9. The method of manufacturing a semiconductor device according to claim 1, wherein
   photon energy of each of said first and second laser lights is higher than band gap energy of said silicon carbide substrate.

\* \* \* \* \*